(12) United States Patent
Hoelscher

(10) Patent No.: US 8,566,050 B2
(45) Date of Patent: Oct. 22, 2013

(54) VITAL CURRENT SENSOR

(75) Inventor: James R. Hoelscher, Rochester, NY (US)

(73) Assignee: Siemens Rail Automation Corporation, Louisville, KY (US)

( * ) Notice: Subject to any disclaimer, the term of this patent is extended or adjusted under 35 U.S.C. 154(b) by 383 days.

(21) Appl. No.: 12/968,944

(22) Filed: Dec. 15, 2010

(65) Prior Publication Data
US 2011/0144933 A1 Jun. 16, 2011

Related U.S. Application Data

(60) Provisional application No. 61/286,522, filed on Dec. 15, 2009.

(51) Int. Cl.
*G06F 19/00* (2011.01)
*G08B 5/00* (2006.01)

(52) U.S. Cl.
USPC ............................................. 702/64; 324/522

(58) Field of Classification Search
USPC ........... 702/58, 64–67, 79, 89, 177, 182–186, 702/193; 324/522, 537, 548; 326/136; 345/76, 212; 361/42; 701/29.6; 340/2.1, 907
See application file for complete search history.

(56) References Cited

U.S. PATENT DOCUMENTS

| | | | | |
|---|---|---|---|---|
| 6,021,366 A | * | 2/2000 | Fieramosca et al. | 701/29.6 |
| 7,635,993 B2 | * | 12/2009 | Boeve | 326/136 |
| 2009/0140745 A1 | * | 6/2009 | Williams et al. | 324/522 |

OTHER PUBLICATIONS

Micro Switch, "Current Sensor: CSD Series, Chart 1", May 23, 2002.
Honeywell Sensing and Control, "Current Sensors: Product Range Guide", Jun. 2010.
Honeywell, "Current Sensor Line Guide", 6 pages, Jun. 2008.

* cited by examiner

*Primary Examiner* — John H Le
(74) *Attorney, Agent, or Firm* — DLA Piper LLP US

(57) ABSTRACT

A system for sensing current that includes a processor and a current sensor coupled to the processor. The current sensor includes a sensor threshold value. The system also includes a current generator coupled to the current sensor. The current generator is operable to generate a test current signal defined by a time-varying linear function. The current sensor is operable to be coupled to an external current source and to output a sensor output signal based on a detected current to the processor. The processor is operable to determine a magnitude of the sensor threshold value based on the sensor output signal.

18 Claims, 10 Drawing Sheets

VITAL CURRENT SENSOR

CROSS REFERENCE TO RELATED APPLICATIONS

This disclosure claims priority from, U.S. Provisional App. Ser. No. 61/286,522, entitled "Vital Current Sensor," filed Dec. 15, 2009, the entirety of which is incorporated by reference herein.

BACKGROUND

The railroad industry, including but not limited to the freight railroad industry, employs wayside lights to inform train operators of various types of operational parameters. For example, colored wayside signal lights are often used to inform a train operator as to whether and how a train may enter a block of track associated with the wayside signal light. The status/color of wayside signal lamps is sometimes referred to in the art as the signal aspect. One simple example is three color system known in the industry as Automatic Block Signaling (ABS), in which a red signal indicates that the block associated with the signal is occupied, a yellow signal indicates that the block associated with the signal is not occupied but the next block is occupied, and green indicates that both the block associated with the signal and the next block are unoccupied. It should be understood, however, that there are many different kinds of signaling systems. Other uses of signal lights to provide wayside status information include lights that indicate switch position, hazard detector status (e.g., broken rail detector, avalanche detector, bridge misalignment, grade crossing warning, etc.), search light mechanism (SA1) position, among others.

In recent years, there has been significant interest providing trains with what is sometimes referred to as PIC (positive train control) equipment in order to prevent collisions between trains. In the U.S., the use of such systems has been mandated by the Federal Railroad Administration in certain applications by 2015. There are many varieties of such PTC systems, but one thing many of them have in common is an onboard computer system that receives signal aspect information and ensures that the train complies with the received signal aspect information. Many of these systems also provide for the onboard receipt of additional information traditionally indicated by wayside lamps, such as switch position and the other types of information listed at the end of the previous paragraph.

In order for such systems to work properly, it is of course necessary for the signal aspect information and other wayside status information to be communicated to the equipment located onboard the train. It will be understood by those of skill in the art that there are many types of wayside signaling systems in use today, including CTC (centralized track control) and ABS (automatic block signaling) systems. In some of these systems, the signal aspects are controlled from a central location, whereas in other systems the signal aspects are controlled by relays in the field using, e.g., track circuits that detect the presence of a train in a block of track associated with the wayside signal device. The wayside signal aspect information from the latter types of system may be transmitted to a central office, but this signal aspect information is not vital and therefore cannot be relied on for the purpose of transmission to a PTC system onboard a train. One solution to the issues raised by the wide variety of wayside signaling systems in use today relies on a common denominator of such systems—the supply of current to signal lamps—by employing current sensors to sense such current in order to determine the wayside signal aspect. In order to use such a technique for the purpose of supplying signal aspect information and other types of wayside status information to an onboard PTC system, it is necessary for the current sensors to be vital.

Additionally, industry personnel often wish to ensure that the lamps in the wayside status information systems discussed above are working. They may do so by periodically changing the lamps, even if they are functioning properly, or by periodically testing the lamps either manually or with an automatic test system. The lamps in such devices can include incandescent lamps employing filaments, LEDs, and other types of lamps. For some types of lamps, wiring errors may allow the lamps to function properly, but may cause false readings in tests. Therefore it may be unclear from a test whether the lamp is working or not. These wiring errors may be hard to detect because the lamps function properly, so testing methods that work in spite of wiring errors are needed.

BRIEF DESCRIPTIONS OF THE DRAWINGS

DETAILED DESCRIPTION

While the following embodiments are discussed in the context of railroad lamp testing, it will be understood that this is for example only, and the scope of this disclosure is not limited to the railroad field. Current sensing can be used in a wide variety of devices and fields. Furthermore, while the following embodiments may be presented for use with specific commercial lamps and testing systems, these are also presented as examples to provide greater understanding of the disclosure to those of ordinary skill in the relevant arts. Also, while some method steps are delineated as separate steps for ease of understanding, any such steps should not be construed as necessarily distinct nor order dependent in their performance.

Figure 1:
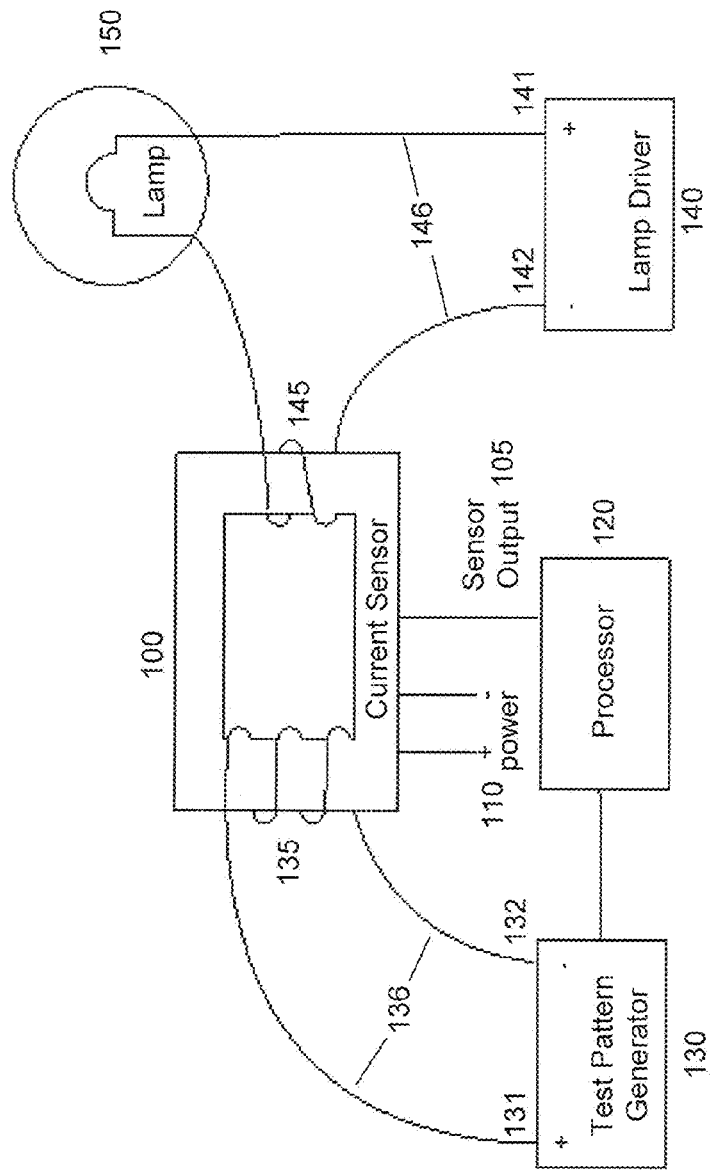
FIG. 1 depicts a current sensor schematic according to an embodiment of the invention.

FIG. 1 is a schematic of a current sensing system according to one embodiment. A lamp 150 with a lamp driver 140 may comprise a device to be monitored. Other current generating devices may be substituted. The lamp driver 140 may drive the lamp 150 in at least on, flashing on/off, and/or off states. When the lamp is on or flashing on, a current may be induced in wires 146. When the lamp is off or flashing off, there may be no current or a residual current in wires 146. Other current generating devices may induce current in wires 146 according to their various states as well.

A digital output current sensor 100 may detect current in wires 146. As will be understood by those of skill in the art, the current sensor is used to measure current flowing through the lamp 150 (or some other device) in order to determine whether the lamp 150 or the lamp driver 140 has failed. The current sensor 100 may also determine the operational state of the lamp 150 or the lamp driver 140, so that this operational state may be reported. For example, a transmitter (not shown) may transmit the operational state to a remote system (e.g., a PTC system and/or display onboard a train) so that a user who is not within visual range of the lamp 150 may know the current operational state of the lamp 150. As will be further understood by those of skill in the art, the current sensor 150 itself may fail. In the case of a digital output current sensor, the sensor 150 may have different failure modes, including a first mode in which the digital output becomes "stuck" and remains in one state or the other regardless of what current is flowing through the device being monitored by the sensor, and a second mode in which the sensor thresholds drift. It is therefore desirable to provide a mechanism, such as a test current generator, in order to ensure that the current sensor itself is functioning properly. Ideally, the test mechanism would function properly regardless of what current may be flowing through the device being monitored by the current sensor. This is helpful, for example, in the case of wayside signaling systems that apply current to lamps independently of a device monitoring the current in the lamps.

Figure 6:
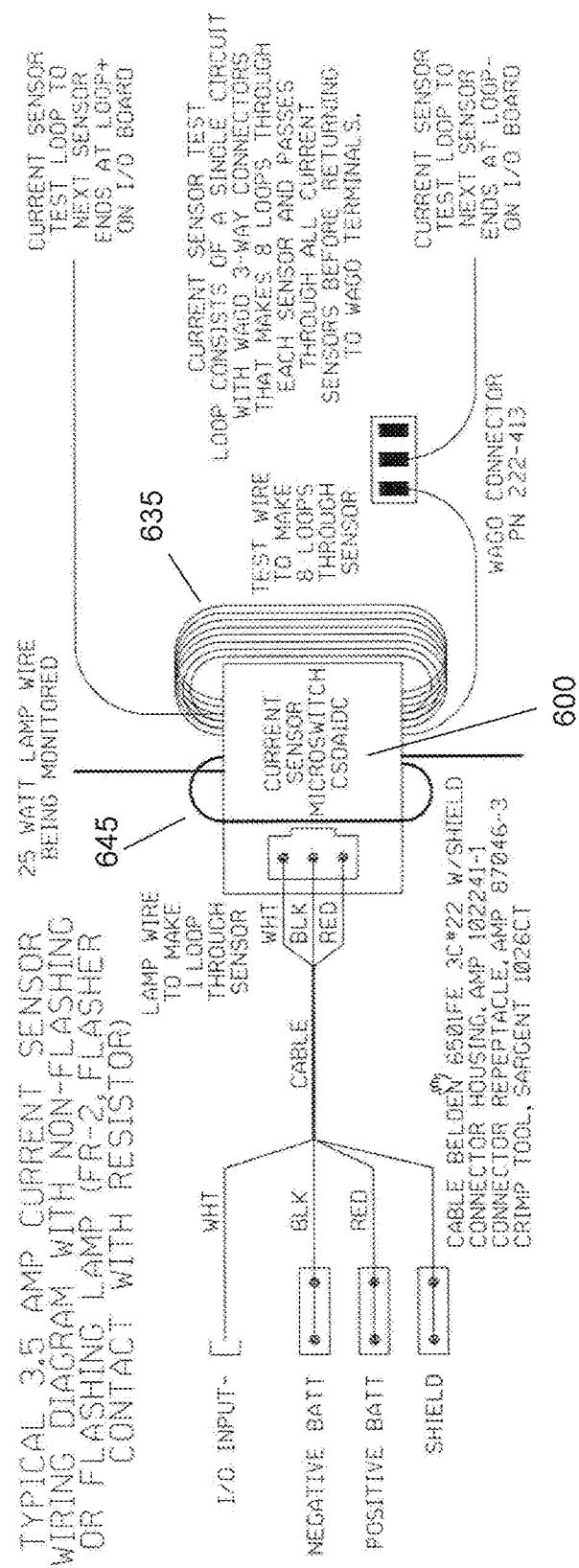
FIG. 6 depicts a sample current sensor wiring schematic according to an embodiment of the invention.
Figure 7:
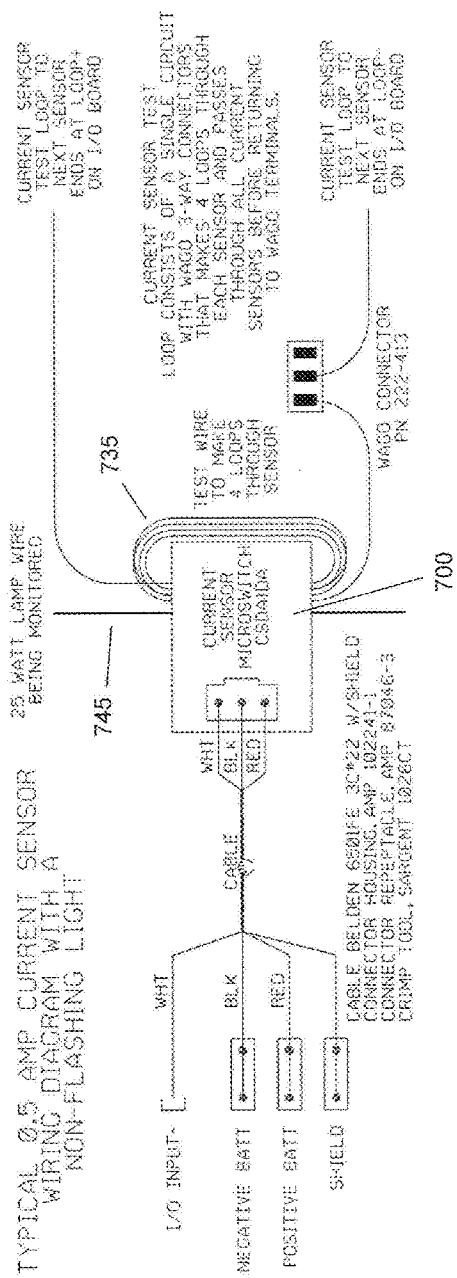
FIG. 7 depicts a sample current sensor wiring schematic according to an embodiment of the invention.

The current sensor 100, which is preferably a digital output current sensor, may be connected to a power source 110. A signal from a test pattern generator 130 may induce a current in wires 136 (e.g., for the purpose of verifying a correct functioning of the current sensor as discussed above). The current sensor 100 may also detect current in wires 136. In the example of FIG. 1, wires 136 connected to the test pattern generator 130 may wind around the current sensor 100 at winding 135. The wires 146 connected to the lamp driver 140 and lamp 150 may wind around the current sensor 100 at winding 145. This arrangement may be suitable for an open loop or closed loop Hall Effect current sensor 100, which may measure currents in windings 135 and 145 by sensing the magnetic fields in the windings 135 and 145. FIGS. 6 and 7 depict two sample wiring diagrams for digital output current sensors which may be used with embodiments of the invention. In FIG. 6, current sensor 600 has standard power and I/O contacts which are known in the art, and also shows lamp winding 645 and test pattern winding 635 (corresponding to windings 145 and 135 of FIG. 1). In FIG. 7, current sensor 700 has standard power and I/O contacts which are known in the art, and also shows test pattern winding 735 which corresponds to winding 135 of FIG. 1. Note that an alternate embodiment of winding 145 of FIG. 1 is shown, wherein lamp wire 745 may be passed through the sensor 700 one time, and not wound around the sensor. It will be appreciated by those of ordinary skill in the relevant art that the current sensor 100 may be a different type of proprietary or off the shelf current sensor and may interface with wires 136 and 146 in other ways. For example, current sensor 100 may be a current clamp sensor with probes that may clamp around wires 136 and 146.

A processor 120 may communicate with the test pattern generator 130 (it should be understood that this communication is optional, and the test pattern generator 130 may operate independently or under the control of some device other than the processor 120). The processor 120 may be able to control the operation of the test pattern generator 130, for example by altering the signal output by the test pattern generator 130 or adjusting the timing of the signal transmission. The processor 120 may be able to synchronize test signal transmissions and/or sensor output 105 samplings to avoid falsely reading known current pulses unrelated to lamp state that may exist in the wires 146. The processor 120 may also receive sensor output signals from the current sensor 100 through a sensor output 105. The processor 120 may be able to process these signals to at least determine the operational state of the lamp 150 and output this operational state to a display (not shown) and/or test the threshold value of the current sensor 100. For example, the current sensor 100 may output a low signal when current is detected in winding 145 and a high signal when no current (or a low residual current) is detected in winding 145. If the current sensor 100 has a threshold value above the residual current value, it may detect the correct operational state of the lamp 150 and/or the threshold value of the current sensor 100 in spite of this residual current. In this case, the processor 120 may interpret the low signal to indicate a lamp on or flashing on state, and a high signal to indicate a lamp off or flashing off state.

Figure 9:
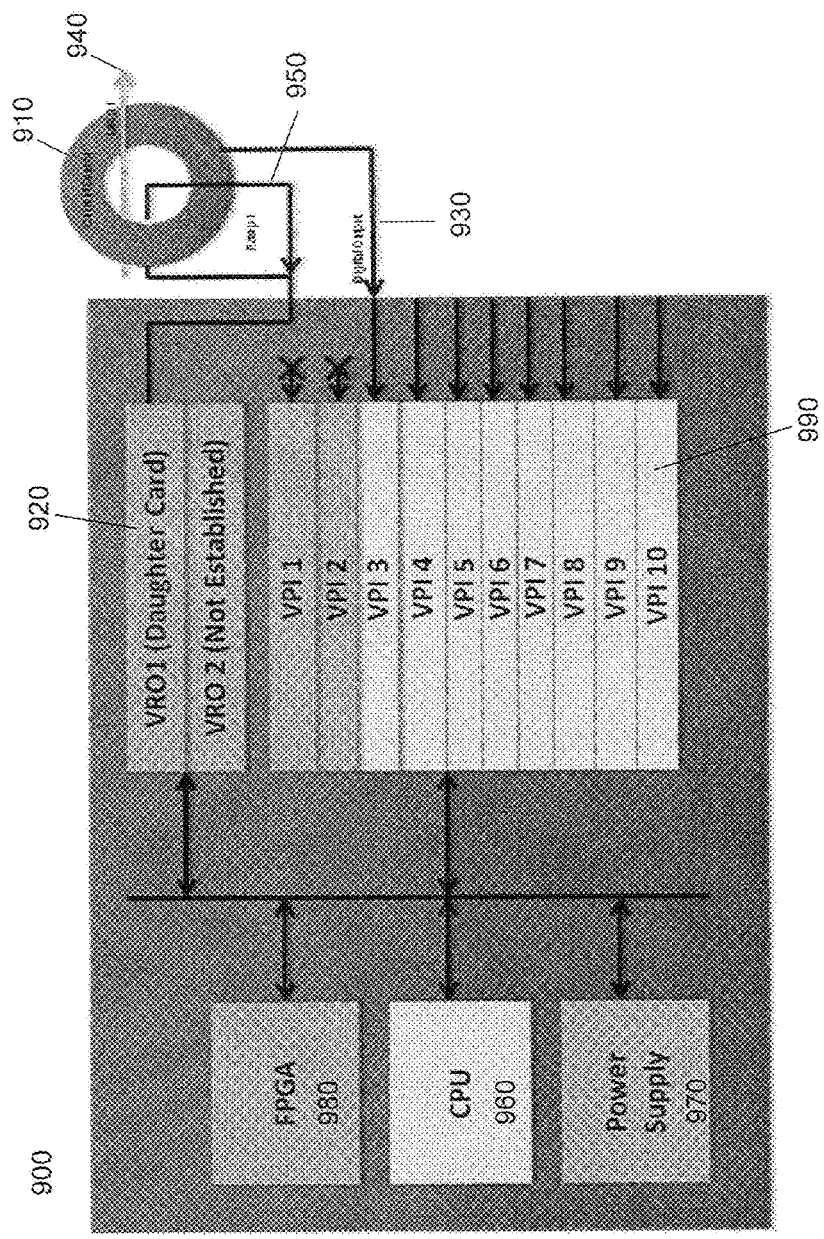
FIG. 9 depicts a processor configuration according to an embodiment of the invention.

FIG. 9 shows a sample embodiment of a processor 900, which may be the processor 120 of FIG. 1, according to an embodiment of the invention. The processor 900 may include at least a CPU 960, a power supply 970, and/or an FPGA circuit 980 which are in communication with one another and with output devices such as test pattern generator daughter card 920 and current sensor inputs 990. In this example, output 920 may send a signal through wire 950, which may be wound around current sensor 910. Lamp circuit 940 may also pass through current sensor 910. Current sensor 910 may communicate outputs to the processor 900 through signal output 930. The processor 900 of FIG. 9 shows the above elements integrated in one circuit, but those of ordinary skill in the art will understand that variations are possible. For example, power supply 970 may be an external or internal supply, various processing functions of CPU 960 and FPGA 980 may be interchanged or eliminated, output devices may be daughter cards 920 or integrated directly with the CPU 960, different winding configurations for wires 940 and 950 may be used, and so on.

Referring now back to FIG. 1, the current sensor 100 may measure current in wires 136 and 146 simultaneously and may output either a sum of the currents of wires 136 and 146 or a difference between the currents of wires 136 and 146, depending on whether the currents have the same polarity or opposite polarities. In the example of FIG. 1, poles 131 and 132 of the test pattern generator 130 and poles 141 and 142 of the lamp driver 140 are arranged so that the polarity in wires 136 and 146 will be the same. However, the current sensor 100 may also detect current in wires 136 and 146 if the polarities of either the test pattern generator 130, the lamp driver 140, or both are reversed from their states in FIG. 1.

Because the polarity of the current in wires 146 could vary depending on how the circuit is wired, the current sensor could detect a change in lamp operational states as a change between 0 and a positive magnitude or 0 and a negative magnitude. For some current sensors 100, such as digital current sensors, if a test current with opposite polarity from the current in wires 146 and of sufficient magnitude is applied by the test pattern generator 130, the state of lamp 150 may not be detected. This is because a test current in windings 135 of sufficient magnitude and opposite polarity could give the current sensor 100 a total current beyond its threshold, resulting in an "on" output regardless of the true state of the lamp 150. Therefore, a test current similar to that shown in FIG. 2 may be applied.

Figure 2:
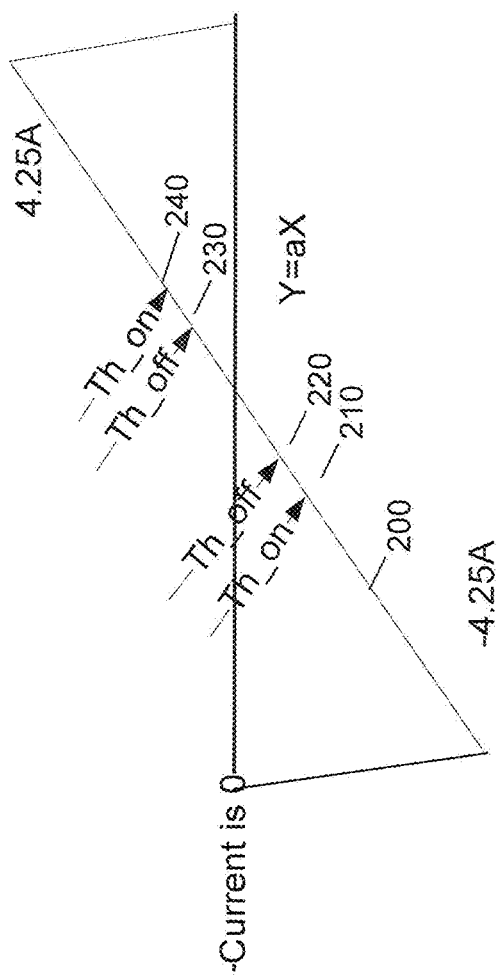
FIG. 2 depicts a test input signal according to an embodiment of the invention.

FIG. 2 depicts a test input signal 200 according to an embodiment of the invention. The example test signal 200 may be a ramp function that transitions from a negative value below a sensor threshold to a positive value above the sensor threshold, or vice versa, so that the sensor output may change state twice. FIG. 2 includes negative threshold on point 210, negative threshold off point 220, positive threshold off point 230, and positive threshold on point 240, which may correspond to current sensor 100 threshold levels. It is noted that the negative "starting current value" for the ramp function may be reached at a point in time slightly after the actual starting time of the generated function. Likewise, the positive "ending current value" may be reached at a point in time slightly before the actual end time of the generated function. In a function transitioning from a positive starting value to a negative starting value, the "starting current value" and "ending current value" may be similarly slightly offset from the true start and end times of the generated function.

As an example, a current sensor 100 may be a digital current sensor having a threshold value of 3.5 A. The lamp circuit 146 may have a residual current in flash off state of 1.4 A and a flash on or on current of 2.5 A. By wiring two turns of the lamp current wire 146 at winding 145, the effective lamp current to the input of the current sensor 100 may become 5 A peak for on and 2.8 A peak for off.

In another example, lamp current may range between 1.3 A and 3.25 A. With lamp 150 in "on" state, to change the sensor output to "off" state, the test current may reduce the lamp current to a release threshold and continue for a time length within which the processor 120 may detect the current sensor output 105 change and also any threshold drifting. The minimum size of this time window may be determined by the smallest sensor "on" threshold, which may be 0.5 A-0.25 A=0.25 A in this example. Thus, the maximum test current may be 3.25 A+0.25 A=3.5 A or higher. For a test pattern generator 130 with a maximum current magnitude of 1 A, the test current wire 136 may be wound around the current sensor 100 four or more times at winding 135.

In another example, a current sensor's 100 smallest sensor "on" threshold may be 3.5 A-1.8 A=1.7 A. Lamp winding 145 may have 2 passes. In this case, an effective maximum lamp current value may be 3.25 A*2=6.5 A. An effective test current may be 6.5 A+1.7 A=8.2 A. Thus, for a test pattern generator 130 with a maximum current magnitude of 1 A, the test current winding 135 may have 9 passes to generate this current.

When the test circuit winding 135 and the lamp winding 145 have been set up, a test current similar to that in FIG. 2 may be used to detect current in winding 145. As seen in FIG. 2, the test current 200 may assume a simple linear function, say Y=aX, where Y is the current and −4≤Y≤4, X is the response time for the sensor 100, and a is the slope. For example, the sensor 100 may be a Honeywell CSDA1AA digital current sensor. Now a value for a may be determined. In the case that the lamp current value is 0, the linear test current 200 may cause sensor output 105 to be low (indicating detected current), then high when the test current crosses the first threshold 210, $Y_1=aX_1$, and low again when the test current crosses the second threshold 220 $Y_2=aX_2$. The pulse of the high output 105 signal may have a width of $$|X_2 - X_1| = \left|\frac{Y_2 - Y_1}{a}\right|.$$

Detection of the high pulse may be facilitated by a sufficient width of the high pulse. Since the smallest value in this example for $|Y_2-Y_1|$ is 0.25 A+0.08 A, or 0.33 A, the pulse width is $$0.33/a, \text{ or } a = \frac{0.33}{T_w}.$$

Total time from −4 to 4 is $$\frac{8}{a} = 24T_w$$

In another example, the sensor 100 may be a Honeywell CSDA1AC digital current sensor with $|Y_2-Y_1|$ is 1.7 A+0.6 A=2.3 A and $$a = \frac{2.3}{T_w}.$$

Total time from −9 to 9 is $$\frac{18}{a} = 7.5T_w.$$

The test ramp 200 may assume a slope determined by $$a = \frac{0.33}{T_w},$$

where $T_w$ is the width of the high pulse (the pulse for the no current detected state of the sensor). The test current 200 may be a linear function of $$Y = \frac{0.33}{T_w}X.$$

The window $T_w$ may be adjusted at a later time. For example, $T_w$ may have an initial value of 1.5 ms, which may be adjustable. When applying the linear test current 200 with a DC component b, the additive current in the sensor is Y=aX+b. The sensor output pattern before, during, and after the linear test current may depend on the direction and magnitude of b.

As described below with respect to FIGS. 3-5, embodiments of the invention may allow the processor 120 to sense the current operational state of a lamp 150 or other current source. The processor 120 may also test and verify the threshold levels of the current sensor 100, regardless of the operational state of the lamp 150 or other current source, and regardless of the polarity of the current in wires 136 and 146. From sensor testing and verification, the processor 120 may determine a failure rate for the sensor 100. For example, assuming the sensor failure rate is Fs in terms of number of failures per hour, if the sensor is checked once every 5 seconds, the sensor failure rate becomes $$\frac{5}{3600}F_s,$$

or $1.4\times10^{-3}F_s$. For error rate below $10^{-9}$, $F_s$ may be less than $7.2\times10^{-7}$. If an anomaly in threshold level of the current sensor 100 indicates a sensor error or failure, an alert may be generated so that the sensor may be repaired or replaced. Therefore, embodiments of the invention enable frequent sensor testing so that defective sensors may be found and fixed promptly.

Figure 3:
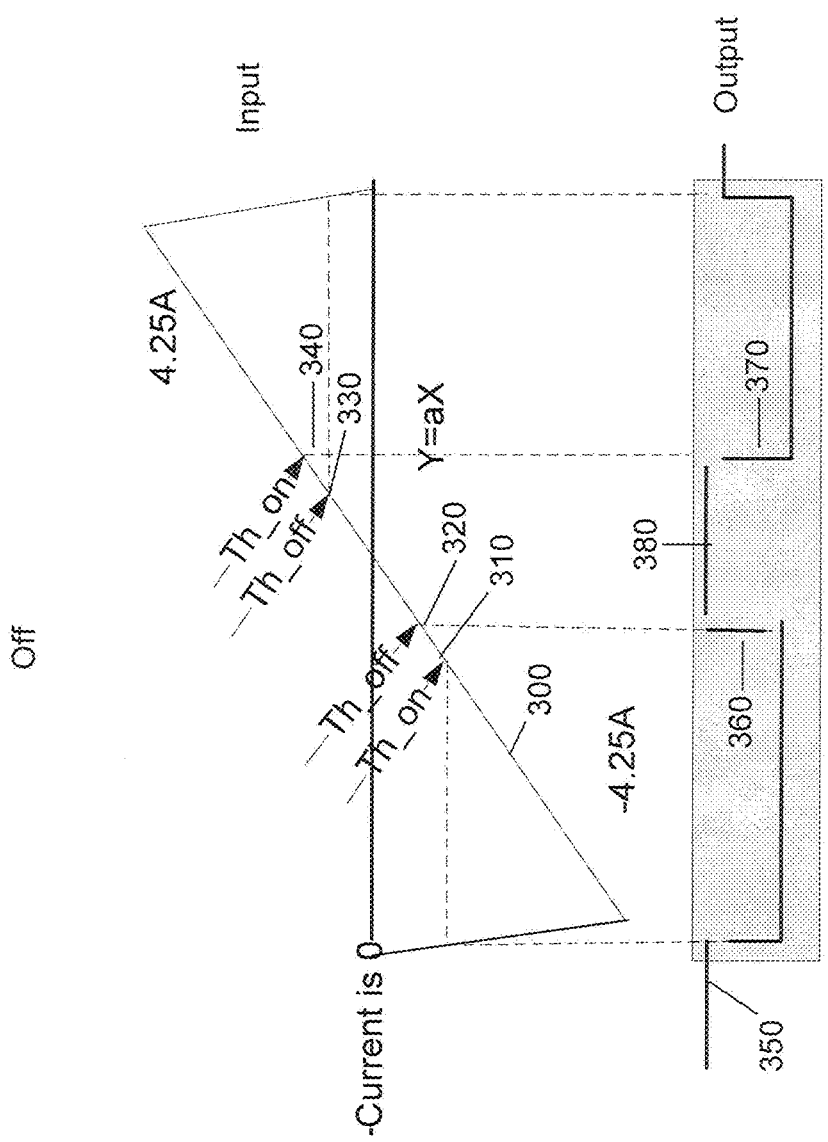
FIG. 3 depicts test input and output signals according to an embodiment of the invention.

FIG. 3 shows test input and output signals when a lamp current is below a sensor threshold according to an embodiment of the invention. FIG. 3 illustrates an output pulse pattern 350 with no detected lamp current, and may apply to AC and/or DC lamp currents. In this example, the sensor output 350 before applying the linear test current 300 may be high, indicating no detected current. The sensor output 350 may change to low when the linear test current is applied. It may go to high at 360 when the linear test current 300 crosses the first threshold of the sensor at 320. It may go to low at 370 when the linear test current 300 crosses the second threshold of the sensor at 340. The width of the high pulse 380 may indicate the value of the sensor threshold. The width of the high pulse may directly correspond with the level of the threshold (i.e., a higher threshold may result in a wider pulse). When the linear test current is removed, the output of the sensor may go to high again. The processor 120 may detect the width of the high pulse 380 and thereby verify the threshold level of the current sensor 100.

Figure 4:
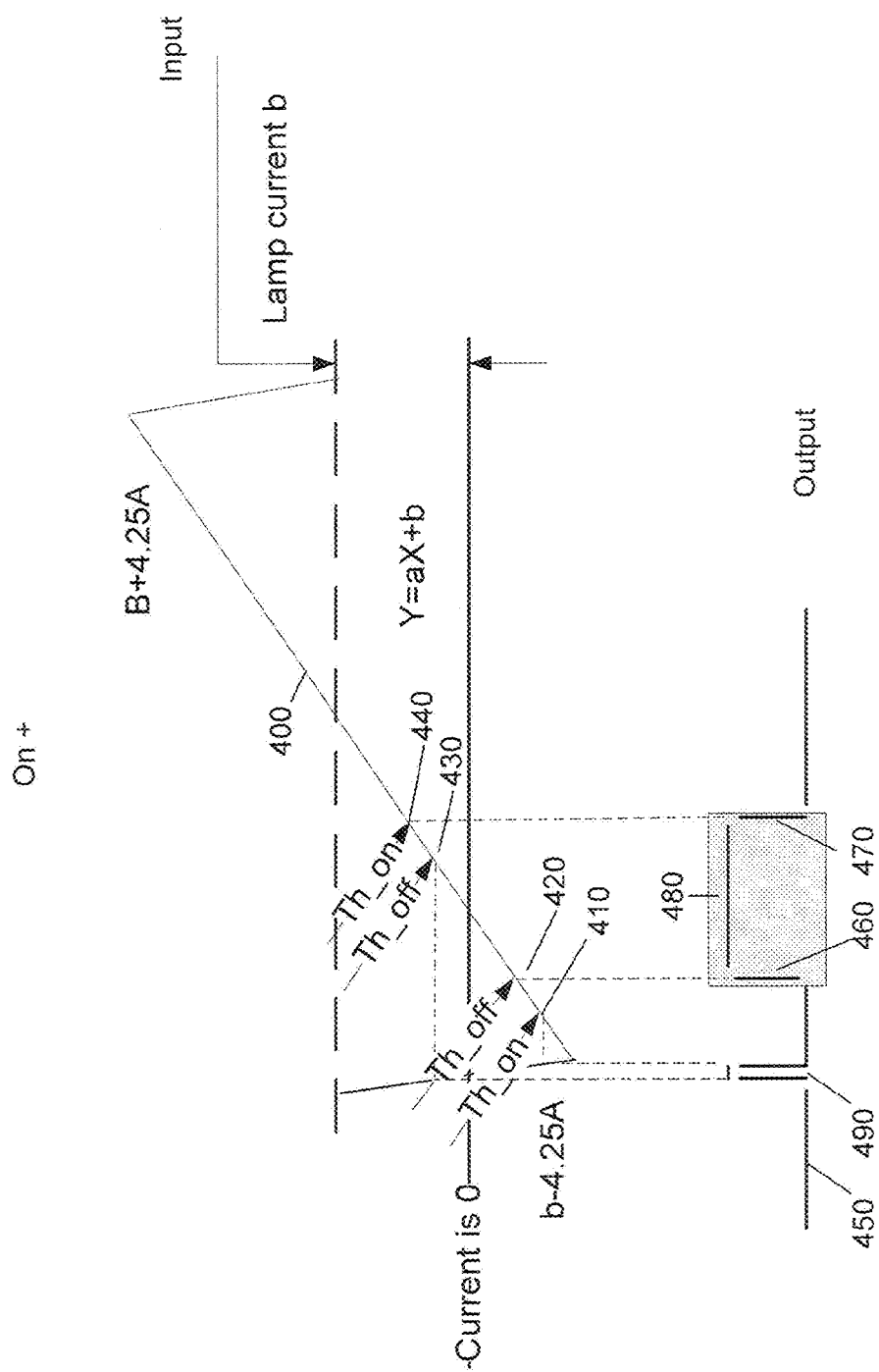
FIG. 4 depicts test input and output signals according to an embodiment of the invention.

FIG. 4 shows test input and output signals when a lamp current is present and has a positive polarity above a sensor threshold according to an embodiment of the invention. The sensor output 450 may be low, indicating a detected lamp current, before applying the linear test current 400. When the test current 400 is applied, the sensor output may or may not go high at 490 depending on the magnitude of lamp current. Eventually the sensor output may go high at 460 when the total current Y=aX+b crosses the first threshold Th_off at 420. As in the example of FIG. 3, the width of this high pulse 480 may indicate the threshold value of the sensor. The higher the threshold, the wider the high pulse 480 may be. The processor 120 may detect the width of the high pulse 480 and thereby verify the threshold level of the current sensor 100.

Figure 5:
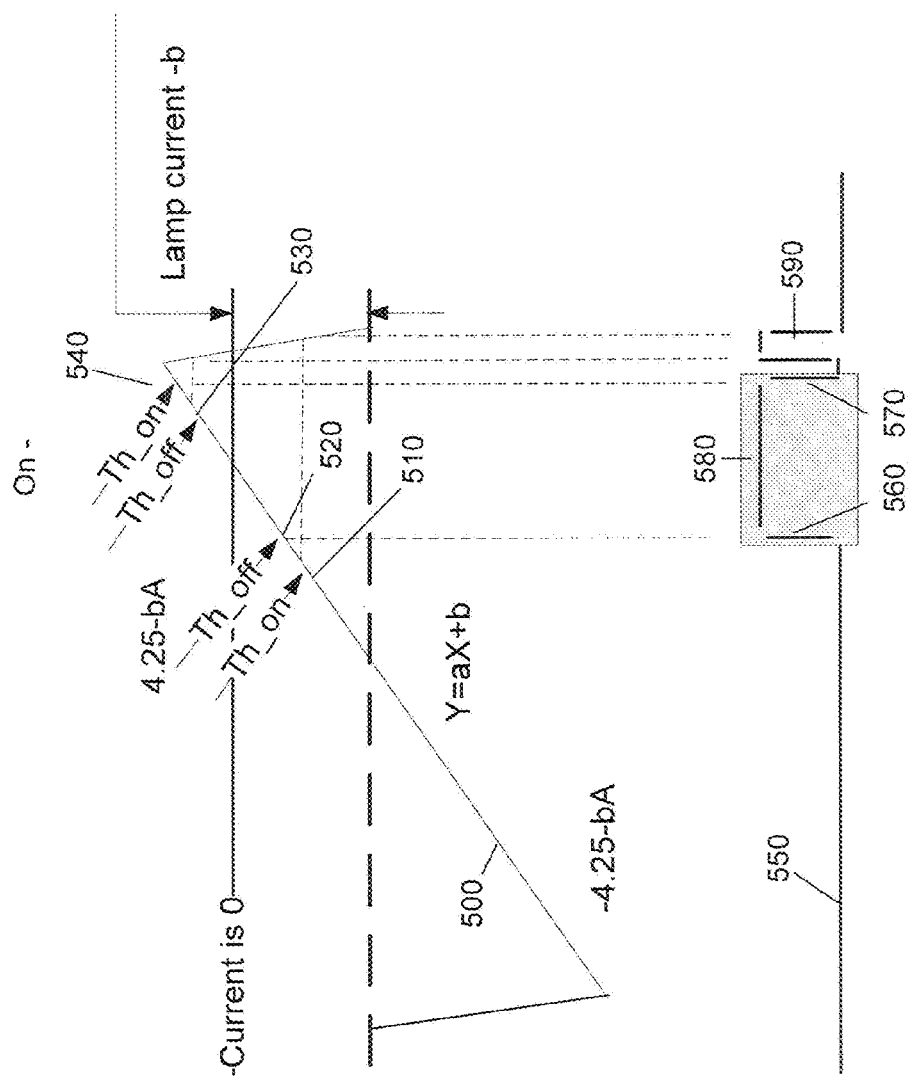
FIG. 5 depicts test input and output signals according to an embodiment of the invention.

FIG. 5 shows test input and output signals when a lamp current is present and has a negative polarity according to an embodiment of the invention. This example is similar to the example of FIG. 4. The threshold 520 is crossed, and the high pulse 580 is formed, later in the time window of the input signal 500, but the width of this high pulse 580 may indicate the threshold value of the sensor, as discussed above. The higher the threshold, the wider the high pulse 580 will be. Also, similarly to FIG. 4, the output signal may spike at 590 when the input signal 500 rapidly falls to an off state. The processor 120 may detect the width of the high pulse 580 and thereby verify the threshold level of the current sensor 100.

Another consideration that may apply in some embodiments is residual current in the lamp circuit 146 causing sensor threshold drifting and subsequent false lamp state reporting. The test pattern as applied in the examples of FIGS. 3-5 above may allow the processor 120 to detect the threshold of the current sensor 100, as described above. Such a periodic sensor test may detect a problem when the threshold drifts high. When the threshold drifts low, residual current (for example a current of 40 mA) may cause the sensor to falsely report an "on" state. In order to prevent this error, a small current, for example 100 mA, may be applied in the "off" state and the sensor 100 may continue to report an "off" state.

Many of the foregoing examples discuss current sensor testing when an external DC current is present. However, some lamp circuits may be driven with AC signals. Also, some lamp circuits may be driven with AC signals (supplied by a power grid, for example) by default, and only use DC power (supplied by a battery, for example) when there is an AC power failure. Embodiments of this invention may be used whether the external current source generates DC or AC currents.

When the AC frequency of the lamp circuit 146 is known, as may be the case when the circuit is powered by a national power grid with known frequency (such as 60 Hz in the United States), it is possible to verify correct operation of the current sensor without using the test pattern generator 130 to generate a test pattern and instead using the AC current driving the lamp as a substitute for the test pattern. It will be understood by those of skill in the art that the sinusoidal shape of an AC current waveform includes portions between the positive and negative peaks that are approximately linear. Thus, if the current sensor is appropriately configured such that the magnitudes of the positive and negative thresholds are within this approximately linear portion, the current sensor will output a waveform having a pulse width that is a function of these thresholds.

When a lamp circuit has an AC current, sampling rates of the current sensor 100 may be considered when sensor testing takes place. The "on" or "flash-on" states of lamp 150 may produce pulse trains. The width of pulses may not be equal. The width may depend on the AC frequency (for example, 50 Hz or 60 Hz), AC magnitude, and/or the sensor 100 threshold. AC frequency may negatively affect pulse width. Also, increasing AC magnitude may lead to more uneven pulses. As an example, an AC frequency of 60 Hz may be used to calculate the minimum pulse width. The lamp current wiring 146 with one winding at 145 may produce a maximum 3.25 A rms or 4.5 A peak magnitude. The CSDA1AA sensor 100, for example, has nominal threshold at 0.5 A, the worst case turn on threshold may be 0.25 A and worst case turn off threshold may be 0.08 A. The minimum pulse width with nominal threshold may be $\sin^{-1}(0.5/4.5)/(2\pi*60)=0.0006$ seconds<0.1 ms. The minimum pulse width with the worst case thresholds may be $\sin^{1}(0.25/4.5)(2\pi*60)+\sin^{-1}(0.08/4.5)(2\pi*60)=0.00019$ seconds. To acquire 4 or more samples within 0.19 ms, the sampling rate may be set as 4/0.00019=21000.

Current sensor 100 may detect the pulse train generated by the AC "on" or "flash on" states. If the minimum pulse width detected substantially corresponds to the minimum pulse width expected based on the thresholds of the current sensor 100, it may be determined that the current sensor 100 is operating properly. If an unexpected sensor output is received, it may be determined that the current sensor 100 is not operating properly.

For systems using AC lamp drivers 140, if a pulse train is not being detected by the current sensor 100, the system may perform a test using the test pattern generator 130 as described with respect to FIGS. 3-6 above. In the event that the lamp 150 enters an "on" or "flash on" state while a test current is being applied, the sensor output may be disregarded for that test. Current sensor 100 may detect the pulse train as described above, or the test pattern generator 130 may be reactivated at a later time.

Figure 10:
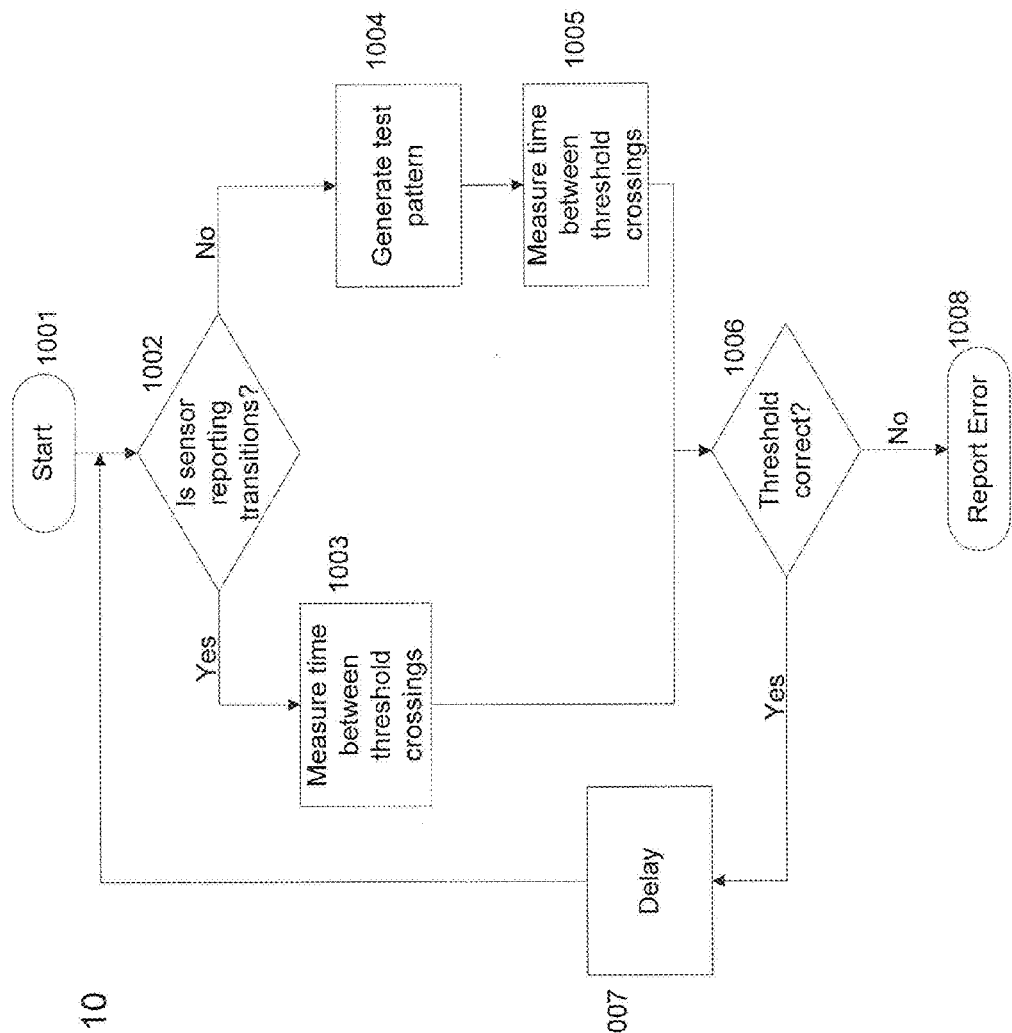
FIG. 10 depicts a flow chart according to an embodiment of the invention.

FIG. 10 is a sample flow chart of a process for testing a current sensor according to an embodiment of the invention. At step 1001, an external current source, such as a lamp, may be coupled to the current sensor and the system may be activated. Step 1002 may begin a test sequence. The processor may monitor current sensor output to determine whether sensor state transitions are being reported. These transitions may indicate a pulse train associated with an AC "on" or "flash on" state is being detected (e.g., such as when a wayside signal lamp is being driven by an independently controlled wayside signal system).

If transitions are being reported, the system may proceed to step 1003, wherein times between threshold transitions may be determined. These determinations may describe, among other things, the expected minimum pulse width based on the thresholds of the current sensor. If the minimum pulse width is found, the thresholds may be deemed correct at step 1006. If not, they may be incorrect at step 1006.

If transitions are not being reported at step 1002, the test pattern generator may generate a test current at step 1004. The current detector may detect threshold crossings which occur while the test current is active, as described above. At step 1005, the processor may measure the time between threshold crossings. At step 1006, the processor may determine whether these transitions occur at the correct times with respect to one another.

After step 1006, if the thresholds are correct, the system may delay at step 1007 before looping back to step 1002 to begin another test. If the thresholds are incorrect, the system may report a current sensor error at step 1008.

Figure 8:
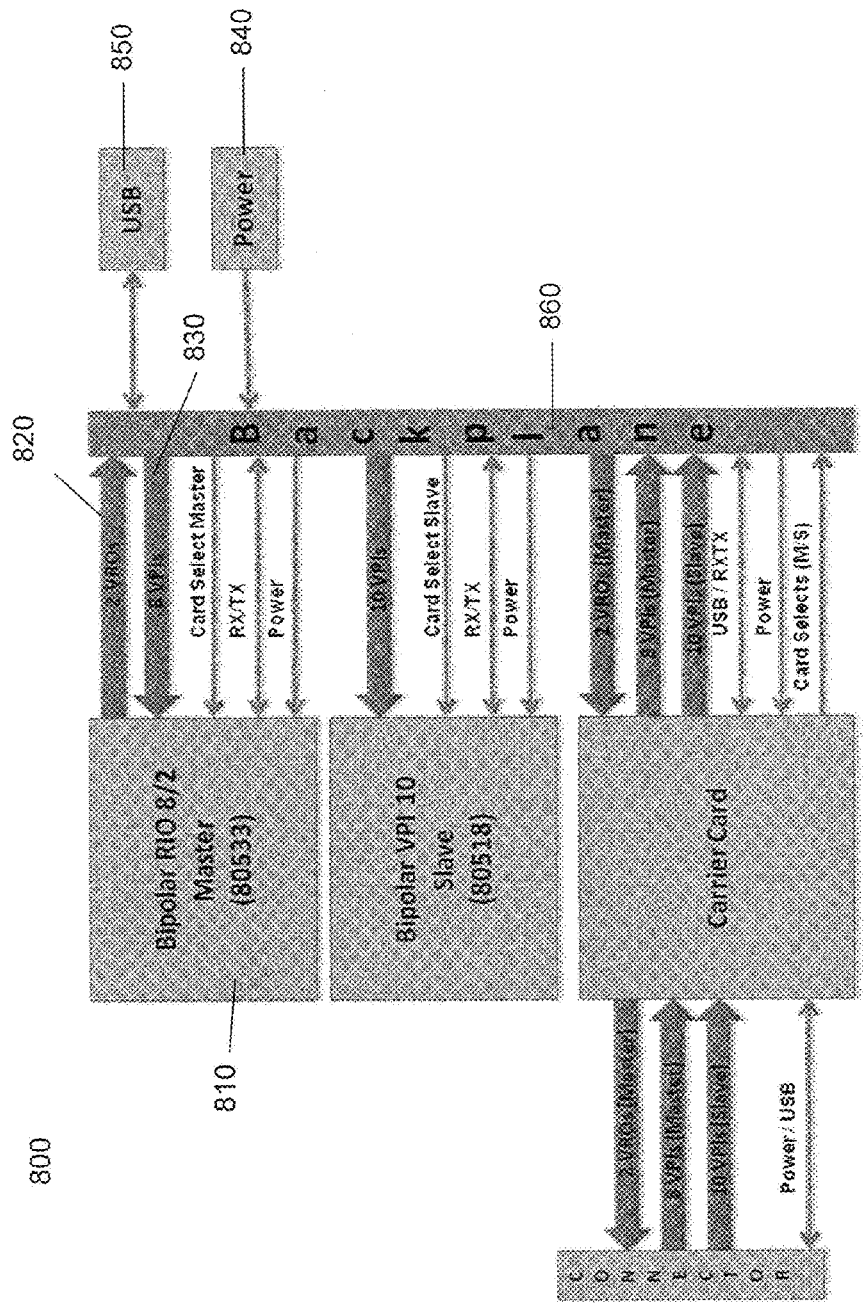
FIG. 8 depicts a sensor unit configuration according to an embodiment of the invention.

Embodiments of the present invention may be incorporated into sensor units which monitor other signals. For example, embodiments may be combined in an enclosure with devices monitoring railroad switch positions, hazard detector statuses, search light mechanism positions, and/or other signals and devices. Embodiments may also be incorporated into units which command railroad wayside devices such as approach lights or crossing start controls. An example of this integration is found in FIG. 8. Unit 800 may have various subsystems, including an embodiment of the present invention at system 810. Outputs 820 and inputs 830 may be accessible through a backplane 860 of the overall unit 800. Additionally, power may be supplied externally by power supply 840, and data gathered by the system 810 may be retrieved using a USB port 850 or similar I/O method.

While various embodiments have been described above, it should be understood that they have been presented by way of example, and not limitation. It will be apparent to persons skilled in the relevant art(s) that various changes in form and detail can be made therein without departing from the spirit and scope. In fact, after reading the above description, it will be apparent to one skilled in the relevant art(s) how to implement alternative embodiments. Thus, the present embodiments should not be limited by any of the above-described embodiments In addition, it should be understood that any figures which highlight the functionality and advantages, are presented for example purposes only. The disclosed methodology and system are each sufficiently flexible and configurable, such that it may be utilized in ways other than that shown.

Further, the purpose of the Abstract of the Disclosure is to enable the U.S. Patent and Trademark Office and the public generally, and especially the scientists, engineers and practitioners in the art who are not familiar with patent or legal terms or phraseology, to determine quickly from a cursory inspection the nature and essence of the technical disclosure of the application. The Abstract of the Disclosure is not intended to be limiting as to the scope of the present invention in any way.

It should also be noted that the terms "a", "an", "the", "said", etc. signify "at least one" or "the at least one" in the specification, claims and drawings.

Finally, it is the applicant's intent that only claims that include the express language "means for" or "step for" be interpreted under 35 U.S.C. §112, paragraph 6. Claims that do not expressly include the phrase "means for" or "step for" are not to be interpreted under 35 U.S.C. §112, paragraph 6.

What is claimed is:

1. A system for sensing current, comprising:
   a processor;
   a current sensor coupled to the processor, the current sensor having a first sensor threshold value and a second sensor threshold value; and
   a current generator coupled to the current sensor;
   wherein the current generator is operable to generate a time-varying linear test current signal having a first value below the first sensor threshold value and a second value above the second sensor threshold value;
   the current sensor is operable to be coupled to an external device and the current generator;
   the current sensor is operable to output a sensor output signal to the processor, the sensor output signal being dependent on a first current associated with the current generator and a second current associated with the external device; and
   the processor is operable to determine a time between a crossing of the first sensor threshold and a crossing of the second sensor threshold.

2. The system of claim 1, wherein the sensor output signal comprises a pulse having a pulse width based on a magnitude of the first sensor threshold and a magnitude of the second sensor threshold.

3. The system of claim 1, wherein:
   the test current signal comprises a starting current value and an ending current value, and
   the starting current value and the ending current value have opposite polarities.

4. The system of claim 1, wherein:
   the external device has at least one operating state; and
   the processor is operable to determine the operating state based on the sensor output signal.

5. The system of claim 1, further comprising a display connected to the processor and operable to display a status of the current sensor.

6. The system of claim 1, wherein the current sensor is a Hall effect sensor.

7. The system of claim 1, wherein the sensor output signal is a digital signal.

8. The system of claim 1, wherein the processor is operable to generate an alert based on the time between the crossing of the first sensor threshold and a crossing of the second sensor threshold.

9. The system of claim 8, further comprising a display operable to display the alert.

10. A method for sensing current, comprising:
    applying a time-varying linear test current to a current sensor, the current sensor having a current sensor output being dependent on a current flowing through an external device and the test current, the current sensor having a first sensor threshold value and a second sensor threshold value;
    determining a time between a crossing of the first sensor threshold and a crossing of the second sensor threshold.

11. The method of claim 10, wherein:
    the test current signal comprises a starting current value and an ending current value, and
    the starting current value and the ending current value have opposite polarities.

12. The method of claim 10, further comprising:
    determining an operating state of the external device based on the sensor output signal.

13. The method of claim 12, further comprising displaying the operating state.

14. The method of claim 10, further comprising generating an alert based on the time between the crossing of the first sensor threshold and a crossing of the second sensor threshold.

15. The method of claim 14, further comprising displaying the alert.

16. The method of claim 10, wherein the sensor output signal is a digital signal.

17. The method of claim 10, wherein the sensor output signal comprises a pulse having a pulse width based on a magnitude of the first sensor threshold and a magnitude of the second sensor threshold.

18. The method of claim 10, wherein the current sensor is a Hall effect sensor.

* * * * *